United States Patent
Gearhardt et al.

(10) Patent No.: US 7,240,264 B2
(45) Date of Patent: Jul. 3, 2007

(54) SCAN TEST EXPANSION MODULE

(75) Inventors: Kevin J. Gearhardt, Fort Collins, CO (US); Douglas J. Feist, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 152 days.

(21) Appl. No.: 11/116,616

(22) Filed: Apr. 28, 2005

(65) Prior Publication Data
US 2006/0248418 A1 Nov. 2, 2006

(51) Int. Cl.
*G01R 31/28* (2006.01)
(52) U.S. Cl. .................... 714/726; 714/734
(58) Field of Classification Search ............... None
See application file for complete search history.

(56) References Cited

U.S. PATENT DOCUMENTS

| | | | | |
|---|---|---|---|---|
| 6,096,085 A | * | 8/2000 | Sammelman | 703/2 |
| 6,157,200 A | * | 12/2000 | Okayasu | 324/753 |
| 6,256,760 B1 | * | 7/2001 | Carron et al. | 714/726 |
| 6,754,868 B2 | * | 6/2004 | Bristow et al. | 714/744 |

* cited by examiner

*Primary Examiner*—Christine T. Tu
(74) *Attorney, Agent, or Firm*—Luedeka, Neely & Graham, P.C.

(57) ABSTRACT

An external scan test module that is adapted to act as an interface between an automated tester and a device under test. The external scan test module includes a scan pattern memory to hold scan patterns for at least one configuration of the device under test. A failure log memory holds failure information for the device under test. A controller sends scan input data to the device under test, receives scan output data from the device under test, and sends and receives signals from the automated tester. An interface receives scan patterns.

3 Claims, 1 Drawing Sheet

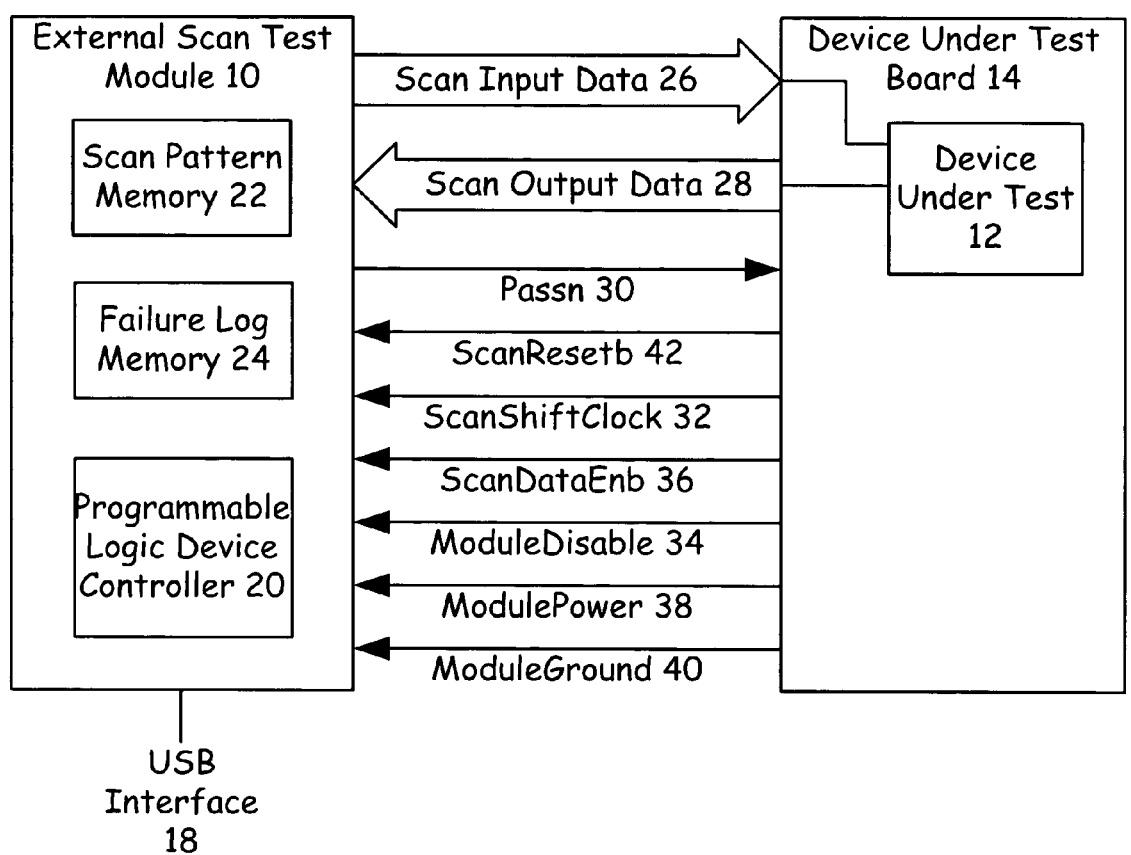

SCAN TEST EXPANSION MODULE

FIELD

This invention relates to the field of integrated circuit fabrication. More particularly, this invention relates to production test requirements for testing integrated circuits using techniques such as stuck-at-fault and timing-delay-fault scan patterns.

BACKGROUND

One problem encountered in the testing of integrated circuits is that the lower cost testers that could ideally be used for testing lower pin count integrated circuits do not have a sufficient amount of scan test memory to provide the test quality levels desired. As the term is used herein, "integrated circuit" includes devices such as those formed on monolithic semiconducting substrates, such as those formed of group IV materials like silicon or germanium, or group III–V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

While testers such as those described above can be upgraded with additional scan test memory, it is very expensive to do so. A full memory upgrade to a tester could range as high as about $400,000. However, this is currently the only existing solution to the problem. These memory upgrades provide a "transparent" solution to the problem, in that an existing tester only needs to be updated to recognize the additional memory capacity. From a test engineer's perspective, nothing changes with respect to the implementation of the associated scan test patterns.

For some testers, that additional capital expenditure is made for a fully depreciated tester, but in every case the upgrade results in increased test costs. For example, when a test subcontractor upgrades one of their testers with the additional scan memory, the test cost per second for that tester is effectively increased for all products tested on that machine, regardless of whether a given product makes use of the additional memory.

What is needed, therefore, is a system whereby problems such as those described above can be overcome, at least in part.

SUMMARY

The above and other needs are met by an external scan test module that is adapted to act as an interface between an automated tester and a device under test. The external scan test module includes a scan pattern memory to hold scan patterns for at least one configuration of the device under test. A failure log memory holds failure information for the device under test. A controller sends scan input data to the device under test, receives scan output data from the device under test, and sends and receives signals from the automated tester. An interface receives scan patterns.

Thus, one primary feature of this invention is the development of a low-cost scan test expansion module that can be used on any available tester platform, adding the desired memory only for those devices under test that require it. The module provides scan memory expansion for a given device under test, is portable between various test systems from the same or different manufacturer, can be pre-programmed for a given device under test to save on test program load times in manufacturing, and includes the diagnostic capabilities required for failure analysis work.

In various embodiments, the external scan test module is removably attached to a device under test board disposed between the device under test and the automated tester. The controller is preferably programmable to selectively electrically disengage from the device under test.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which is a functional block diagram of an external scan test module according to a preferred embodiment of the present invention.

DETAILED DESCRIPTION

According to a preferred embodiment of the present invention, there is provided an external scan test module 10 that can be connected to the device under test 12 via a connector on the probe interface board that is used for the wafer sort testing, or to the final test board for the package test. The external scan test module 10 is preferably comprised of interface logic, control logic 20, scan pattern memory 22, and failure log memory 24. The memory used in the external scan test module 10 is preferably standard, commercially available flash memory, and the logic functions described in the following sections are preferably implemented in a programmable logic device 20, which helps to keep development and implementation costs to a minimum.

The interface logic of the external scan test module 10 handles communications with an external programmer/failure analysis workstation (preferably PC-based) that facilitates loading scan pattern data to the external scan test module 10 and reading failure data back from the external scan test module 10. All required scan test patterns that are to reside in the external scan test module 10 are preferably loaded by the external programmer through a port 18 such as a USB 2.0 compliant serial interface. This pattern loading operation can be performed independently of the normal automated test equipment test loading operation, which can lead to better efficiency in the manufacturing test environment by pre loading an external scan test module 10 with the patterns for a specific device under test 12 prior to its scheduled testing. The external programmer/failure analysis workstation can also read back failure data from the external scan test module 10 during a device 12 debug or analysis operation on the automated test equipment, to provide a test or failure analysis engineer with detailed failure logs.

The interface logic also provides the operational interface to the device under test 12/automated test equipment hardware that is required to perform device testing. This interface preferably consists of scan data for thirty-two scan chains (sixty-four pins—thirty-two scan in 26 and thirty-two scan out 28), a pass/fail bit 30 to be monitored by the automated test equipment, a shift clock 32 to be provided by the automated test equipment to shift the scan data to and from the device under test 12, a relay control signal 34 provided by the automated test equipment to allow isolation of the module 10 scan pins from the device under test 12, and a data enable signal 36 provided by the automated test equipment that can put the scan in data from the module 10 in a high impedance state during a pattern execution.

The thirty-two channels of scan in data 26 to be provided to the device under test 12 preferably have programmable drive levels to facilitate testing of current and future device technologies with varying power domain levels. The thirty-two channels of scan out data 28 to be received from the device under test 12 preferably also have programmable thresholds to accommodate similar requirements. The pass/fail 30 from the module 10 and shift clock 32 and control signals 34 to the module 10 can be any desired voltage level since they do not interface to the actual device under test 12, but for the purposes of example are defined in one embodiment to operate in a 3.3 volt power domain.

In addition to the hardware portion of the invention as described herein, there is also a software module to support the programming of the external scan test module 10 via, for example, a PC-based workstation. Other software supports the diagnostic functions of the external scan test module 10.

The external scan test module block 10 represents the module 10 described generally above. Within that module 10 there are three basic components: (1) a flash memory array for scan pattern data 22, which is sized and implemented based on the desired scan pattern memory depth, (2) a flash memory array which is sized to support the desired failure log 24, and (3) a programmable logic device controller 20 which preferably handles all of the required logic and interfacing operations.

The pattern data flash memory array 22 is preferably ninety-six bits in width by the desired memory depth for scan pattern implementation. Using a depth of 128 megabits, for example, would provide an increase of a factor of eight in scan memory capacity beyond what is currently available on a typical low-cost tester platform supporting thirty-two scan chains. There are preferably three bits of width for each scan chain supported: a first for scan input data 26 to the device under test 12, a second for scan output data 28 from the device under test 12, and a third mask bit used by the programmable logic device controller 20 to allow for masking of non-deterministic scan output data from the device under test 12.

The failure log flash memory array 24 is preferably of a width based on thirty-two bits of scan log data, plus a number of bits sufficient to capture the scan pattern data address corresponding to a failure. As a device 12 is tested on the automated test equipment, the programmable logic device controller 20 preferably captures the failing scan address and data in an internal SRAM memory array. Then, at the end of testing, the user can tell the external scan test module 10 (such as via the USB interface 18) to save that data in the failure log flash memory array 24 for further analysis off the tester.

The programmable logic device controller 20 is preferably designed and implemented to support all of the necessary logic functions for operation of the external scan test module 10 in both a production and diagnostic mode.

The automated test equipment device under test board 14 block represents the device under test 12 and the automated test equipment signals and power required for operation of the external scan test module block 10. The tester hardware used for testing the device under test 12 preferably has an appropriate mechanical connector to allow the attachment of the external scan test module 10. The device under test board 14 is preferably designed to allow the connection of the thirty-two scan inputs 26 and outputs 28 of the device under test 12 to and from the aforementioned connector, as well as the control signals 34, power 38, and ground 40.

During device testing, the automated test equipment controls the source of data to the device under test's 12 scan inputs with respect to sourcing that data from the automated test equipment's pin electronics or the external scan test module's 10 scan input data. This is done via the ScanDataEnb 36 signal shown in the FIGURE. This signal is controlled by the automated test equipment, and when low, turns on the drivers of the external scan test module 10. When high, the external scan test module 10 drivers are in a high impedance state. This allows the automated test equipment to switch data sources on the fly during a scan pattern execution, thereby facilitating two data sources for the device's scan input signals.

The automated test equipment sources scan pattern data from the external scan test module 10 via the ScanShiftClock 32 signal. A rising edge on this signal 32 forces the external scan test module 10 to increment its internal address generator to move to the next scan vector cycle. The external scan test module 10 address generator is reset at the start of testing for each device under test 12 via the ScanResetb 42 signal from the automated test equipment. Finally, the external scan test module 10 is preferably completely isolated from the device under test 12 via the ModuleDisable 34 signal from the automated test equipment. When taken high, a bank of sixty-four relays within the module 10 open and physically disconnect the sixty-four scan 26 input and output 28 channels.

Thus, one primary feature of this invention is the development of a low-cost scan test expansion module 10 that can be used on any available tester platform. The module provides scan memory expansion for a given device under test 12, is portable between various test systems from the same or different manufacturer, can be pre-programmed for a given device under test 12 to save on test program load times in manufacturing, and includes the diagnostic capabilities required for failure analysis work.

One advantage of this invention is its low cost relative to the upgrade costs associated with typical automated test equipment. Its portability between systems means that only enough modules need to be available to support the products being tested. This means that a manufacturing test operation does not have to schedule product based on which testers have or have not been upgraded with a tester vendor's own scan expansion solution. Finally, this scan test expansion module can in theory provide whatever amount of memory is needed to support a product's automated test program vector capacity, going beyond what is available from a tester manufacturer.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An external scan test module adapted to act as an interface between an automated tester and a device under test, the external scan test module comprising:

a scan pattern memory adapted to hold the first scan patterns for at least one configuration of the device under test, a failure log memory adapted to hold failure information for the device under test, a controller adapted to,
- send scan input data to the device under test,
- receive scan output data from the device under test, and
- send signals to and receive signals from the automated tester, where the signals received from the automated tester include a data enable signal that selectively engages and disengages the external scan test module under the control of the automated tester, such that when the external scan test module is disengaged, the second scan patterns for the device under test originate from the automated tester and when the external scan test module is engaged, the first scan patterns for the device under test originate from the scan pattern memory, and an interface adapted to receive the first scan patterns.

2. The external scan test module of claim 1, wherein the external scan test module is removably attached to a device under test board disposed between the device under test and the automated tester.

3. The external scan test module of claim 1, wherein the controller is programmable to selectively electrically disengage from the device under test.

* * * * *